(12) United States Patent
Saunders et al.

(10) Patent No.: US 7,082,589 B2
(45) Date of Patent: Jul. 25, 2006

(54) METHOD OF GENERATING A SCHEMATIC DRIVEN LAYOUT FOR A HIERARCHICAL INTEGRATED CIRCUIT DESIGN

(75) Inventors: Michael J. Saunders, Ft. Collins, CO (US); Norman E. Mause, Ft. Collins, CO (US); C. Chip Brewster, Ft. Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 279 days.

(21) Appl. No.: 10/704,922

(22) Filed: Nov. 10, 2003

(65) Prior Publication Data

US 2005/0102645 A1    May 12, 2005

(51) Int. Cl.
*G06F 17/50* (2006.01)

(52) U.S. Cl. .............................. 716/11; 716/9
(58) Field of Classification Search ............. 716/9, 716/11
See application file for complete search history.

(56) References Cited

U.S. PATENT DOCUMENTS

| | | | | |
|---|---|---|---|---|
| 5,249,133 A | * | 9/1993 | Batra | 716/5 |
| 5,473,546 A | | 12/1995 | Filseth | |
| 6,009,251 A | * | 12/1999 | Ho et al. | 716/5 |
| 6,505,323 B1 | * | 1/2003 | Lipton et al. | 716/3 |
| 2003/0018948 A1 | * | 1/2003 | Chang et al. | 716/8 |

OTHER PUBLICATIONS

U.S. Appl. No. 10/231,904, filed Aug. 30, 2002, Dillon et al.

* cited by examiner

*Primary Examiner*—Vuthe Siek
*Assistant Examiner*—Tuyen To
(74) *Attorney, Agent, or Firm*—Eric James Whitesell

(57) ABSTRACT

A method of generating a schematic driven layout for an integrated circuit design includes steps of: (a) receiving as input a representation of a integrated circuit design comprising a hierarchy of blocks; (b) selecting a block in the hierarchy of blocks that requires a physical design and that contains no missing components; (c) generating a physical design for the selected block so that the selected block is no longer a missing component of any other block; and (d) repeating steps (b) and (c) until a physical design has been generated for each block in the hierarchy of blocks.

4 Claims, 4 Drawing Sheets

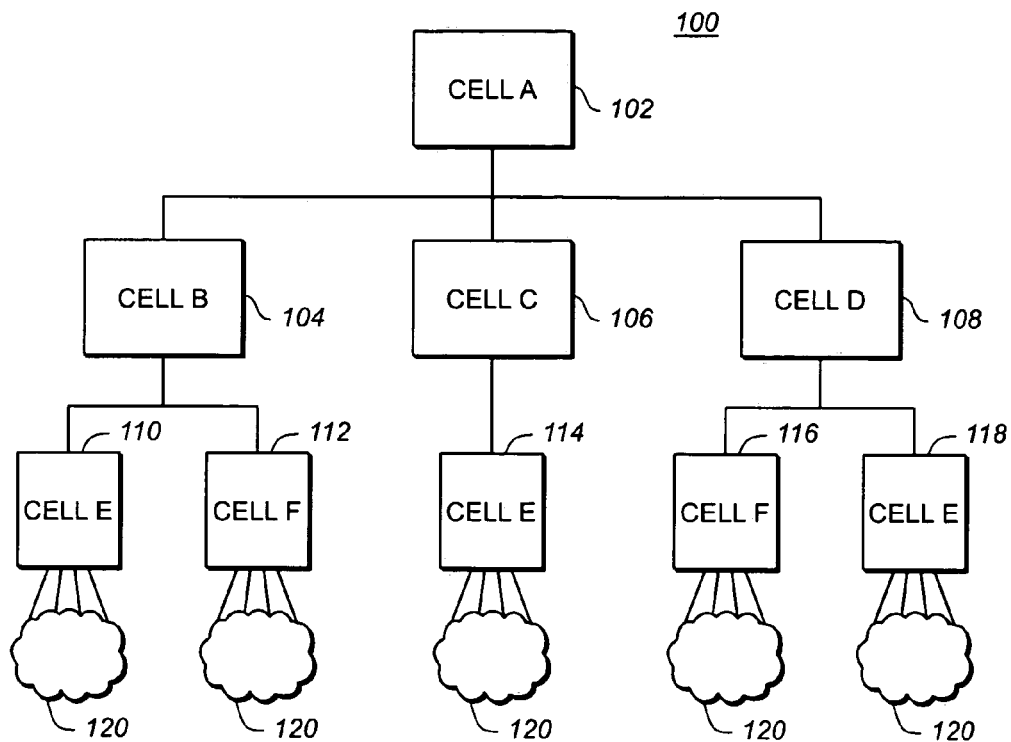
FIG._1 (PRIOR ART)
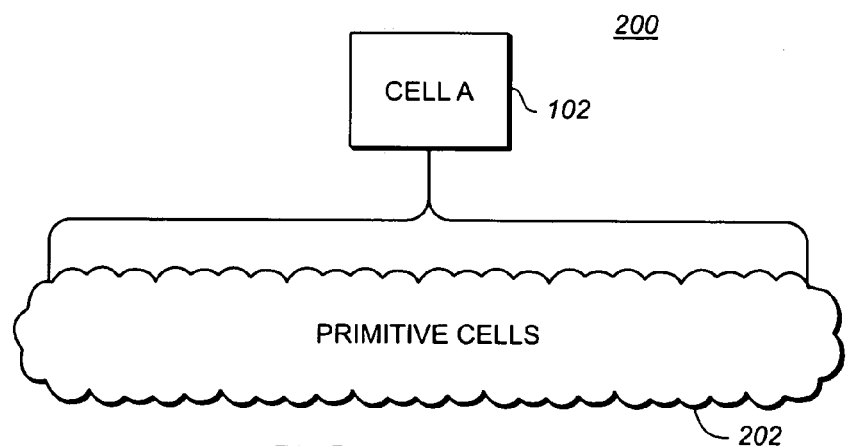
FIG._2 (PRIOR ART)

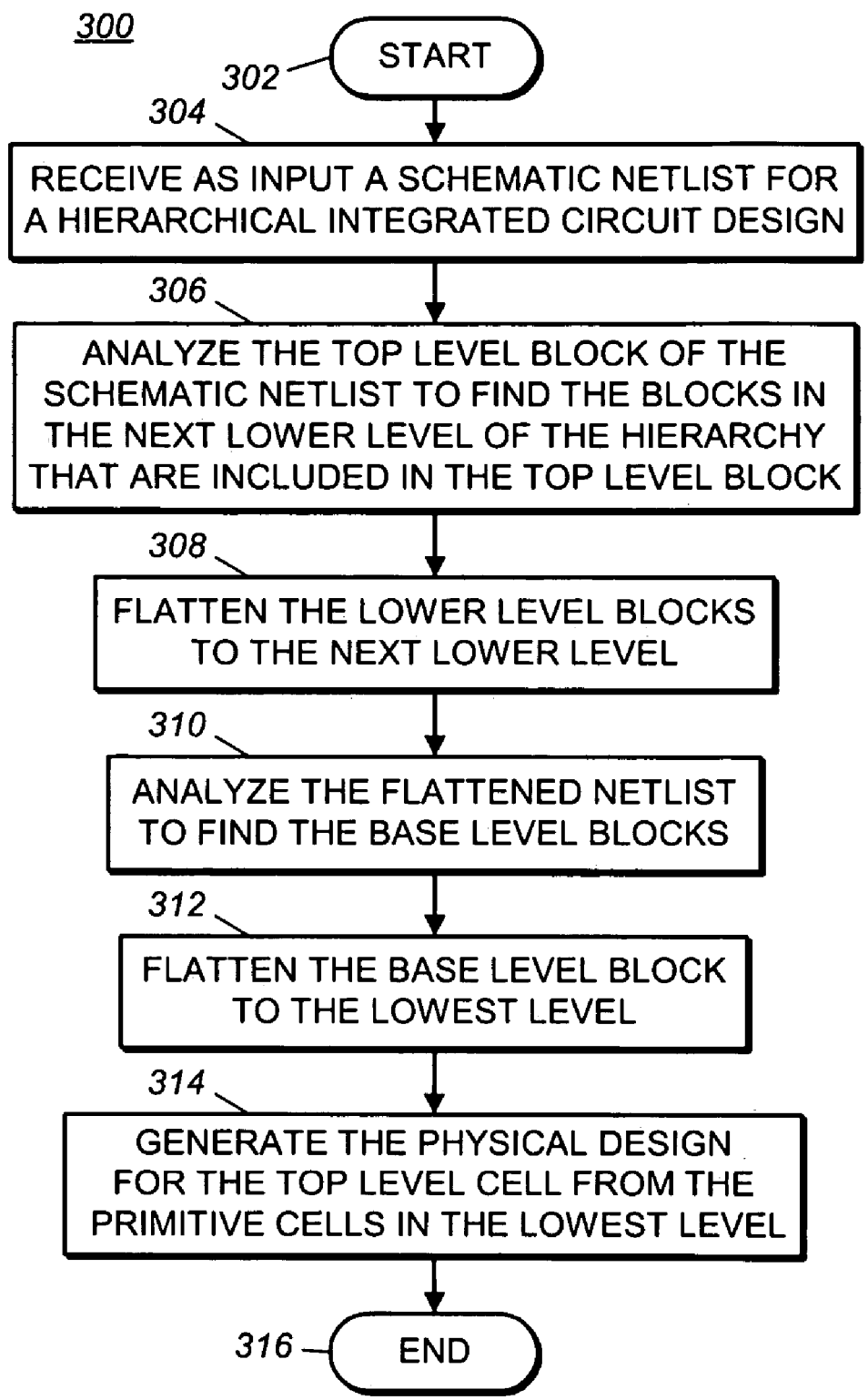
FIG._3
(PRIOR ART)

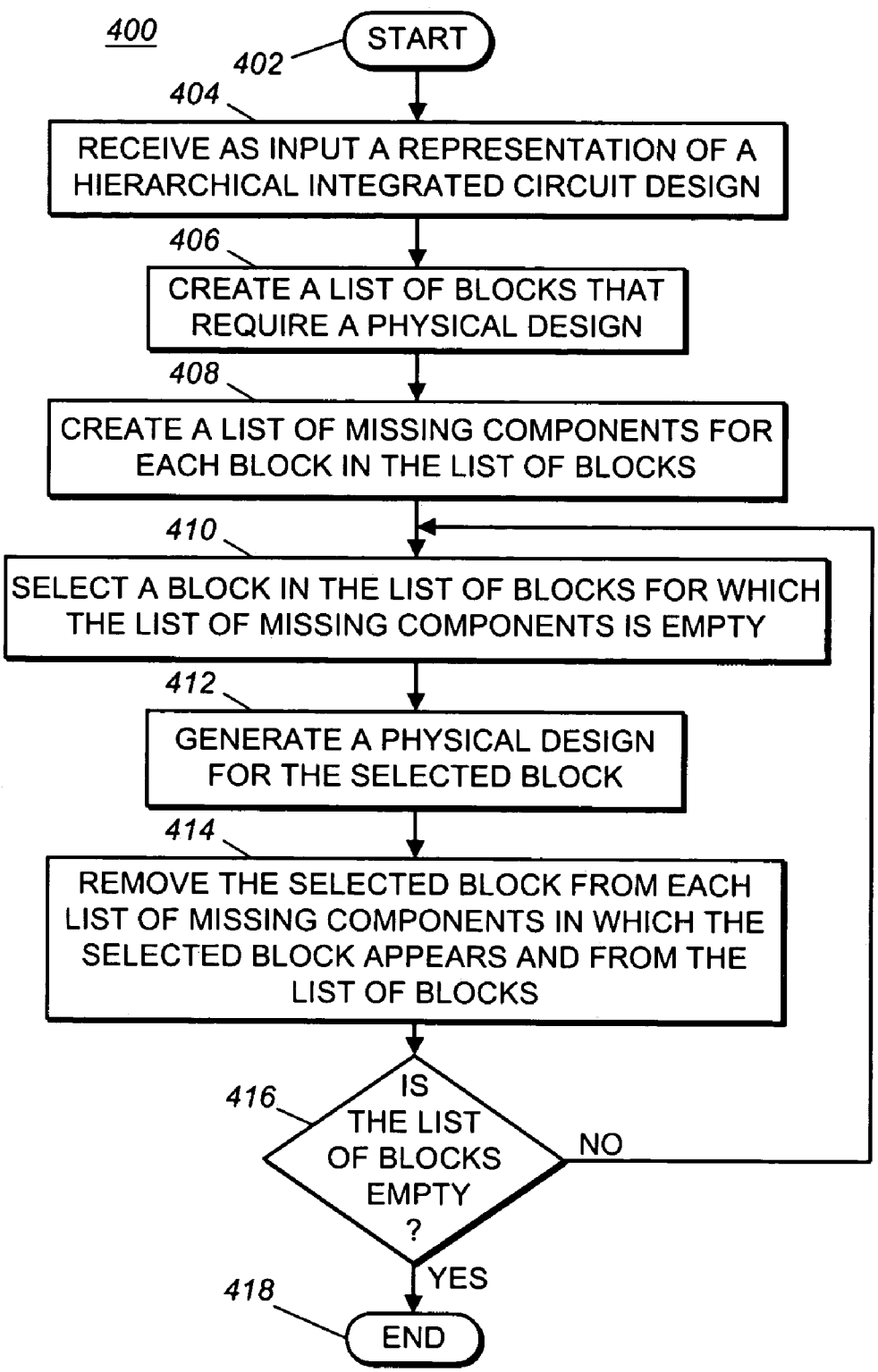
FIG._4

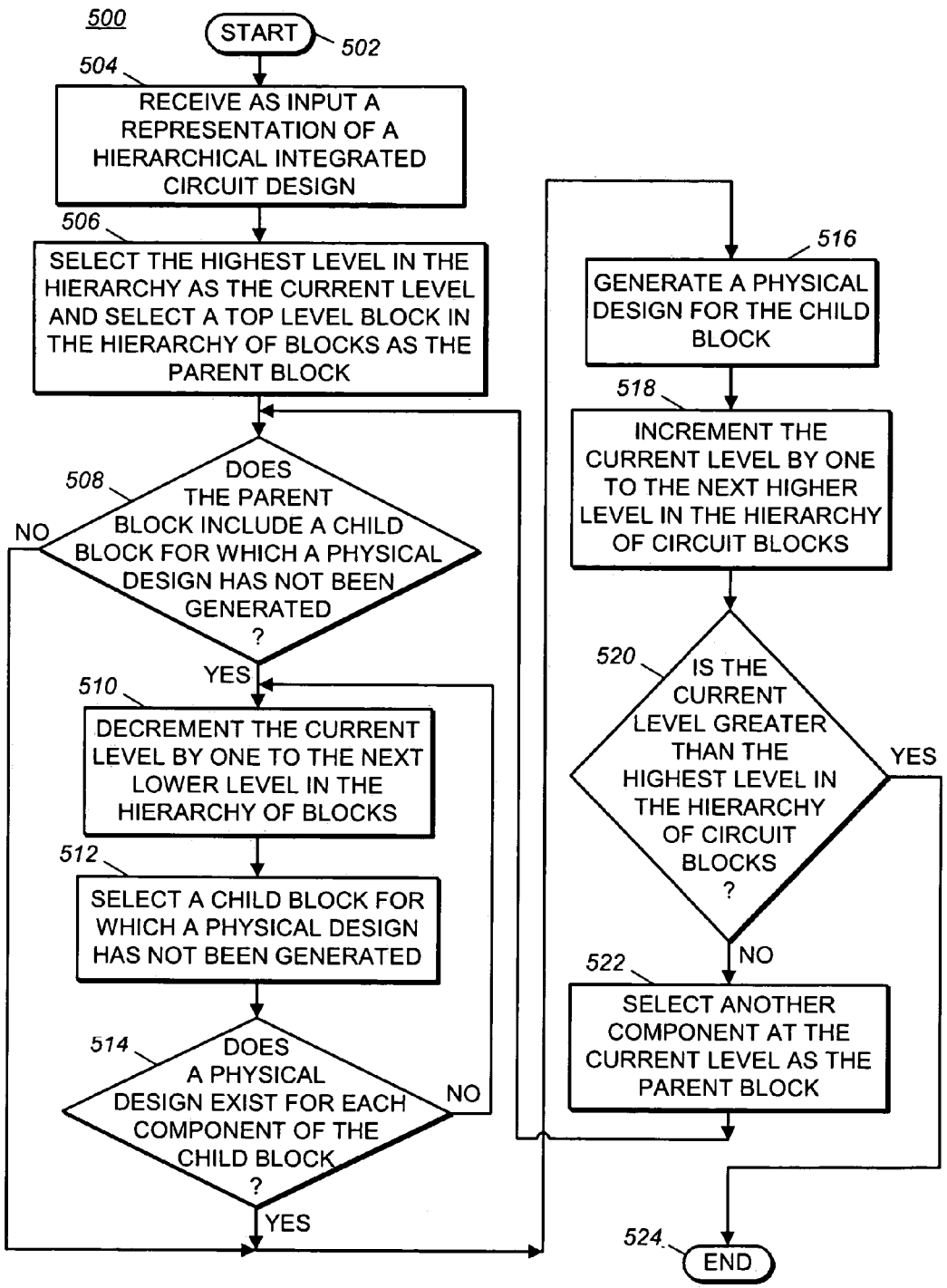
FIG._5

METHOD OF GENERATING A SCHEMATIC DRIVEN LAYOUT FOR A HIERARCHICAL INTEGRATED CIRCUIT DESIGN

BACKGROUND OF THE INVENTION

1. Field of the Invention

The present invention relates generally to the design of integrated circuits. More specifically, but without limitation thereto, the present invention relates to methods of generating a layout for a hierarchical integrated circuit design.

2. Description of Related Art

Typically, a layout, or physical design, for an integrated circuit is generated from a schematic. A schematic defines the logical functions performed by the integrated circuit and how the functions are interconnected. The layout, or floorplan, defines the physical components used to construct the functions defined in the schematic. For economy of design, a schematic for an integrated circuit design typically contains basic functions that are combined to form function blocks that are combined to form more complex function blocks, and so on. This type of schematic is referred to as a hierarchical schematic. In previous methods for generating a layout for the integrated circuit, the hierarchical schematic is flattened or expanded to generate a layout for every instance of every function block in the integrated circuit design.

SUMMARY OF THE INVENTION

In one aspect of the present invention, a method of generating a schematic driven layout for an integrated circuit design includes steps of:

(a) receiving as input a representation of a integrated circuit design comprising a hierarchy of blocks;

(b) selecting a block in the hierarchy of blocks that requires a physical design and that contains no missing components;

(c) generating a physical design for the selected block so that the selected block is no longer a missing component of any other block; and (d) repeating steps (b) and (c) until a physical design has been generated for each block in the hierarchy of blocks.

In another aspect of the present invention, a method of generating a schematic driven layout for an integrated circuit design includes steps of:

(a) receiving as input a representation of a integrated circuit design comprising a hierarchy of blocks;

(b) selecting a highest level in the hierarchy of blocks to be a current level and a top level block in the hierarchy of blocks to be a parent block;

(c) if the parent block includes a child block for which a physical design has not been generated, then continuing from step (d), else transferring control to step (g);

(d) decrementing the current level by one;

(e) selecting a child block at the current level for which a physical design has not been generated;

(f) if a physical design exists for each component of the child block, then transferring control to step (g), else transferring control to step (d);

(g) generating a layout for the child block;

(h) incrementing the current level by one;

(i) if the current level is greater than the highest level in the hierarchy of circuit blocks, then transferring control to step (k), else transferring control to step (j);

(j) selecting another component at the current level as the parent block and transferring control to step (c); and (k) terminating.

In a further aspect of the present invention, a computer program product for generating a schematic driven layout for an integrated circuit design includes:

a medium for embodying a computer program for input to a computer; and a computer program embodied in the medium for causing the computer to perform steps of:

(a) receiving as input a representation of a integrated circuit design comprising a hierarchy of blocks;

(b) selecting a block in the hierarchy of blocks that requires a physical design and that contains no missing components;

(c) generating a physical design for the selected block so that the selected block is no longer a missing component of any other block; and (d) repeating steps (b) and (c) until a physical design has been generated for each block in the hierarchy of blocks.

In another aspect of the present invention, a computer program product for generating a schematic driven layout for an integrated circuit design includes:

a medium for embodying a computer program for input to a computer; and a computer program embodied in the medium for causing the computer to perform steps of:

(a) receiving as input a representation of a integrated circuit design comprising a hierarchy of blocks;

(b) selecting a highest level in the hierarchy of blocks to be a current level and a top level block in the hierarchy of blocks to be a parent block;

(c) if the parent block includes a child block for which a physical design has not been generated, then continuing from step (d), else transferring control to step (g);

(d) decrementing the current level by one;

(e) selecting a child block at the current level for which a physical design has not been generated;

(f) if a physical design exists for each component of the child block, then transferring control to step (g), else transferring control to step (d);

(g) generating a layout for the child block;

(h) incrementing the current level by one;

(i) if the current level is greater than the highest level in the hierarchy of circuit blocks, then transferring control to step (k), else transferring control to step (j);

(j) selecting another component at the current level as the parent block and transferring control to step (c); and (k) terminating.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a diagram of a typical hierarchical schematic design of the prior art;

FIG. 2 illustrates a diagram of a flattened schematic netlist generated from the hierarchical schematic design of FIG. 1.

FIG. 3 illustrates a flow chart of a typical method of generating a schematic driven layout for the schematic netlist of FIG. 1 according to the prior art.

FIG. 4 illustrates a flow chart for a method of generating a schematic driven layout for a hierarchical integrated circuit design according to an embodiment of the present invention; and FIG. 5 illustrates a flow chart for a method of generating a schematic driven layout for a hierarchical integrated circuit design according to an alternative embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

Integrated circuit designs are typically tested by a computer simulation of the integrated circuit design from a schematic netlist. A schematic or logical netlist describes the logical connection of hierarchical elements in an integrated circuit design. The hierarchical elements are cells or modules that are replicated to construct larger circuit blocks or cells, and so on for each level of the hierarchy.

FIG. 1 illustrates a diagram of a typical hierarchical schematic design 100 of the prior art. Shown in FIG. 1 are a top level block 102, first level blocks 104, 106 and 108, and base level blocks 110, 112, 114, 116 and 118, and primitive cells 120.

The base level blocks 110, 112, 114, 116 and 118 consist of primitive cells 120 such as transistors, resistors, and capacitors for which the physical designs, or layouts, are predefined in a cell library included in the design database. Each cloud of primitive cells 120 may include any combination of cells that are predefined in a cell library. The first level blocks 104, 106 and 108 include components comprising the base level blocks 110, 112, 114, 116 and 118. Similarly, the top level block 102 includes the components comprising the first level blocks 104, 106 and 108.

Previous methods typically used in the layout of integrated circuit designs for application specific integrated circuits (ASIC) are based on flattening the schematic netlist, which disadvantageously does not retain the hierarchical structure of the design and instead generates a layout for the entire integrated circuit that repeats every instance of each block in each level down to the lowest level cells in the hierarchy. As a result, the physical designer is left with hundreds or thousands of base level, that is, lowest level devices such as transistors, resistors, and capacitors that must all be wired individually.

FIG. 2 illustrates a diagram of a flattened schematic netlist 200 generated from the hierarchical schematic design 100 of FIG. 1. Shown in FIG. 2 are a top level cell 102 and primitive cells 202.

In FIG. 2, the top level block 102 is expanded or flattened by generating the layouts for each instance of the base level blocks 110, 112, 114, 116 and 118. The hierarchical organization represented by the first level blocks 104, 106 and 108 is hidden, which complicates the task of the physical designer to understand the function of the integrated circuit so that appropriate changes to the physical design may be recognized and correctly implemented.

FIG. 3 illustrates a flow chart 300 of a typical method of generating a schematic driven layout for the schematic netlist 100 of FIG. 1 according to the prior art.

Step 302 is the entry point of the flow chart 300.

In step 304, a representation of a hierarchical integrated circuit design is received as input. The representation of the hierarchical integrated circuit design may be, for example, a schematic netlist, a binary design database, a print-out of the design, and so on. In the following example, a schematic netlist is used to represent the hierarchy of circuit blocks that constitute the integrated circuit design.

In step 306, the top level block 102 of the schematic netlist is analyzed to find the blocks 104, 106 and 108 in the next lower level of the hierarchy that are included in the top level block 102.

In step 308, the lower level blocks 104, 106 and 108 have not yet been generated, so the lower level blocks 104, 106 and 108 are flattened to the next lower level.

In step 310, the flattened netlist is analyzed to find the base level blocks 110, 112, 114, 116 and 118.

In step 312, the base level blocks 110, 112, 114, 116 and 118 have not yet been generated, so the base level blocks 110, 112, 114, 116 and 118 are flattened to the lowest level, which consists only of primitive cells 120.

In step 314, the physical design for the top level cell 102 is generated from the primitive cells according to well known techniques.

Step 316 is the exit point of the flow chart 300.

The physical design for the top level cell 102 is complete and is constructed entirely from primitive cells. As a result, the physical design for the top level cell 102 does not match the hierarchy of the schematic netlist and does not reuse layouts of previously generated blocks.

On the other hand, if the hierarchy of the schematic netlist were maintained during the layout generation, then the physical designer would only have to generate a layout once for each different base level block. Every instance of the layout for a base level block may then be generated by incorporating the layout previously generated for the corresponding base level block by reference, minimizing redundant effort. For example, if an integrated circuit design uses the cell "DRIVER", where "DRIVER" consists of 10 transistors, and if there are 15 instances of "DRIVER" in the integrated circuit design, then the layout engineer would only have to finalize the layout for the cell "DRIVER" once. In the previous method, the physical designer must connect and finalize (10×15=150) transistors in the flattened netlist.

The physical design for each higher level block may be generated by including a reference to the physical design for each lower level block constituting the higher level block in the hierarchical netlist until the physical design for the top level block is completed. Not only may the time and effort of generating a layout for the integrated circuit design be advantageously reduced by this method, but also any change that is needed in the physical design of a block need only be made once. The physical design changes are automatically propagated to every instance of the block in the schematic hierarchy because the references to the each instance of the physical design block now point to the updated physical design.

In one aspect of the present invention, a method of generating a schematic driven layout for an integrated circuit design includes steps of:

(a) receiving as input a representation of a integrated circuit design comprising a hierarchy of blocks;

(b) selecting a block in the hierarchy of blocks that requires a physical design and that contains no missing components;

(c) generating a physical design for the selected block so that the selected block is no longer a missing component of any other block; and (d) repeating steps (b) and (c) until a physical design has been generated for each block in the hierarchy of blocks.

FIG. 4 illustrates a flow chart 400 for a method of generating a schematic driven layout for a hierarchical integrated circuit design according to an embodiment of the present invention.

Step 402 is the entry point of the flow chart 400.

In step 404, a representation of a integrated circuit design, such as a schematic netlist, is received as input.

In step 406, a list of blocks that require a physical design is created. In the example of FIG. 1, the list of blocks includes blocks 102, 104, 106, 108, 110, 112, 114, 116 and 118.

In step 408, for each block in the list of blocks, a list of missing components is created. A missing component of a selected block is a block that is included in the selected block for which a physical design is required. For example, block 102 includes block 104. Because block 104 requires a physical design, block 104 is included in the list of missing components for block 102. On the other hand, block 110 includes only the primitive cells 120. The physical design of the primitive cells 120 is available from a cell library, therefore the list of missing components for block 110 is empty.

In step 410, a block in the list of blocks is selected for which the list of missing components is empty.

In step 412, a physical design of the selected block is generated according to well known techniques.

In step 414, the selected block is removed from each list of missing components in which the selected block appears and from the list of blocks.

In step 416, step 410 is repeated in a cycle until the list of blocks is empty, at which point the cycle is terminated, and step 416 is followed by step 418.

Step 418 is the exit point of the flow chart 400.

Applying the method of FIG. 4 to the example of FIG. 1, the list of blocks includes blocks 102, 104, 106, 108, 110, 112, 114, 116 and 118. The list of missing components for the base level block 110 (Cell "E") is empty, since the physical designs for the primitive cells 120 are predefined in a cell library. A layout is generated for the base level block 110, and the references to Cell "E" are removed from the list of blocks and from the lists of missing components for blocks 104 (Cell "B"), 106 (Cell "C") and 108 (Cell "D").

The list of missing components for block 106 is now empty, therefore a layout for block 106 may be generated. The reference to block 106 is removed from the list of blocks and from the list of missing components for block 102.

The list of missing components for the base level block 112 (Cell "F") is empty, since the physical designs for the primitive cells 120 are predefined in a cell library. A layout is generated for the base level block 112, and the references to Cell "F" are removed from the list of blocks and from the missing component lists for blocks 104 (Cell "B") and 108 (Cell "D").

The list of missing components for block 104 is now empty, and a layout for block 104 may be generated. The reference to block 106 is removed from the list of blocks and from the list of missing components for block 102.

The list of missing components for block 108 is now empty, and a layout for block 108 may be generated. Also, the reference to block 108 is removed from the list of blocks and from the list of missing components for block 102.

The list of missing components for block 102 is now empty, and a layout for block 102 may be generated. Also, the reference to block 102 is removed from the list of blocks.

The list of blocks is now empty, and the cycle is terminated.

In a further aspect of the present invention, a method of generating a schematic driven layout for an integrated circuit design includes steps of:

(a) receiving as input a representation of a integrated circuit design comprising a hierarchy of blocks;

(b) selecting a highest level in the hierarchy of blocks to be a current level and a top level block in the hierarchy of blocks to be a parent block;

(c) if the parent block includes a child block for which a physical design has not been generated, then continuing from step (d), else transferring control to step (g);

(d) decrementing the current level by one;

(e) selecting a child block at the current level for which a physical design has not been generated;

(f) if a physical design exists for each component of the child block, then transferring control to step (g), else transferring control to step (d);

(g) generating a layout for the child block;

(h) incrementing the current level by one;

(i) if the current level is greater than the highest level in the hierarchy of circuit blocks, then transferring control to step (k), else transferring control to step (j);

(j) selecting another component at the current level as the parent block and transferring control to step (c); and (k) terminating.

FIG. 5 illustrates a flow chart 500 for a method of generating a schematic driven layout for a hierarchical integrated circuit design according to an alternative embodiment of the present invention.

Step 502 is the entry point of the flow chart 500.

In step 504, a schematic netlist is received as input for a integrated circuit design comprising a hierarchy of blocks.

In step 506, the highest level in the hierarchy of blocks is selected as the current level, and a top level block in the hierarchy of blocks is selected as the parent block.

In step 508, if the parent block includes a child block for which a physical design has not been generated, then control is transferred to step 510, otherwise control is transferred to step 516. A child block for which a physical design has not been generated may be found, for example, by maintaining a list of names of child blocks for which a physical design has been generated and comparing the name of the child block with the names of the child blocks in the list.

In step 510, the current level is decremented by one to the next lower level in the hierarchy of blocks.

In step 512, a child block at the current level for which a physical design has not been generated is selected.

In step 514, if a physical design exists for each component of the child block, then control is transferred to step 516, else control is transferred to step 510.

In step 516, a physical design is generated for the child block.

In step 518, the current level is incremented by one to the next higher level in the hierarchy of blocks.

In step 520, if the current level is greater than the highest level in the hierarchy of circuit blocks, then control is transferred to step 524, otherwise control is transferred to step 522.

In step 522, another component at the current level is selected as the parent block, and control is transferred to step 508.

Step 524 is the exit point of the flow chart 500.

In the example of FIG. 1, the highest level in the hierarchy of circuit blocks is equal to three and the top level block is block 102. Block 102 includes blocks 104, 106 and 108. A physical design for block 104 was not yet generated, so block 104 is selected as the current block and the current level is set to two. Block 104 includes block 110. A physical design for block 110 was not yet generated, so block 110 is selected as the current block and the current level is set to one. Level one is the lowest level, so a physical design for block 110 is generated from the primitive cells 120. The current level is incremented to two, and the process continues until the physical design of the top level block 102 is completed.

The physical design for the top level block generated according to the method 500 of FIG. 5 advantageously retains the hierarchical structure of the schematic netlist of the integrated circuit design, simplifying the analysis of the design, the speed of generating a physical design, and the implementation of design changes.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The steps described above with regard to the flow charts described above may also be implemented by instructions performed on a computer according to well known computer programming techniques.

While the invention herein disclosed has been described by means of specific embodiments and applications thereof, numerous modifications and variations could be made thereto by those skilled in the art without departing from the scope of the invention set forth in the following claims.

What is claimed is:

1. A method of generating a schematic driven layout for an integrated circuit design comprising steps of:
   (a) receiving as input a representation of an integrated circuit design comprising a hierarchy of blocks;
   (b) creating a list of missing components for each block in the hierarchy of blocks wherein a missing component is a block that requires a physical design and is included in the block for which the list of missing components is created;
   (c) selecting a block in the hierarchy of blocks for which the list of missing components includes no block that requires a physical design;
   (d) removing the selected block from each list of missing components in which the selected block appears; and
   (e) generating as output a physical design for the selected block wherein the selected block is no longer a missing component of any other block.

2. The method of claim 1 further comprising a step of repeating steps (c), (d), and (e) until a physical design has been generated for each block in the hierarchy of blocks.

3. A computer program product for generating a schematic driven layout for an integrated circuit design comprising:
   a medium for embodying a computer program for input to a computer; and
   a computer program embodied in the medium for causing the computer to perform steps of:
   (a) receiving as input a representation of an integrated circuit design comprising a hierarchy of blocks;
   (b) creating a list of missing components for each block in the hierarchy of blocks wherein a missing component is a block that requires a physical design and is included in the block for which the list of missing components is created;
   (c) selecting a block in the hierarchy of blocks for which the list of missing components includes no block that requires a physical design;
   (d) removing the selected block from each list of missing components in which the selected block appears; and
   (e) generating as output a physical design for the selected block wherein the selected block is no longer a missing component of any other block.

4. The computer program product of claim 3 further comprising a step of repeating steps (c), (d), and (e) until a physical design has been generated for each block in the hierarchy of blocks.

* * * * *